United States Patent [19]

Peterson

[11] Patent Number: 4,837,174
[45] Date of Patent: Jun. 6, 1989

[54] METHOD FOR PRODUCING THIN CONDUCTIVE AND SEMI-CONDUCTIVE LAYERS IN MONO-CRYSTAL SILICON

[75] Inventor: Sture Peterson, Uppsala, Sweden

[73] Assignee: Stiftelsen Institutet for Microvagsteknik VID, Sweden

[21] Appl. No.: 79,500

[22] Filed: Jul. 30, 1987

[30] Foreign Application Priority Data

Aug. 29, 1986 [SE] Sweden ........................ 8603652

[51] Int. Cl.⁴ .................................. H01L 21/265
[52] U.S. Cl. ..................... 437/24; 148/DIG. 23; 148/DIG. 24; 148/DIG. 83; 437/20; 437/930
[58] Field of Search ................... 437/20, 24, 930

[56] References Cited

U.S. PATENT DOCUMENTS

| 4,096,622 | 6/1978 | MacIver ........................ 437/39 |
| 4,343,082 | 8/1982 | Lepselter ....................... 437/41 |
| 4,577,396 | 3/1986 | Yamamoto et al. ........... 437/39 |

OTHER PUBLICATIONS

Sanchez et al., in Proc. Materials Research Soc. Symp., vol. 51, 1986, pp. 439–444.
Kozicki et al., in Inst. of Physics Conf. Ser. #67, Section 3, 1983, Oxford, p. 137.
Sigmund et al., in Ion–Implantation: Ed. Ryssel et al., Springer, N.Y. 1983, p. 473.
Namvar et al., in Mat. Res. Soc. Symp. #27, 1984, Ed. Hubler et al., Elsevier, N.Y., p. 341.
Tung et al., Appl. Phys. Letts. 48 (Mar. 1986), 635.
Campisi et al., in Mat. Res. Soc. Symp. Proc., vol. 54 (Mar. 15, 1986) pp. 7 47–752.

Primary Examiner—Upendra Roy
Attorney, Agent, or Firm—Silverman, Cass, Singer & Winburn, Ltd.

[57] ABSTRACT

A method for producing thin conductive or semiconductive layers embedded in silicon in the manufacture of structures for integrated circuits and the like. The invention is characterized by implanting metal atoms (14) in a silicon substrate (15) to a pre-determined nominal depth, and subsequently causing the implanted metal atoms to be redistributed, to form a conductive or a semiconductive layer (16), by heat-treating the silicon substrate (15).

8 Claims, 2 Drawing Sheets

METHOD FOR PRODUCING THIN CONDUCTIVE AND SEMI-CONDUCTIVE LAYERS IN MONO-CRYSTAL SILICON

BACKGROUND OF THE INVENTION

1. Field of the Invention

The present invention relates to a method for producing thin conductive and semi-conductive layers embedded in silicon, preferably mono-crystalline silicon.

2. Description of the Related Art including information disclosed under 37 CRF §§1.97–1.99

There is today a great interest in the construction of rapid amplifying stages in silicon, i.e. in conjunction with the manufacture of integrated circuits.

In recent times so-called permeable-base transistors have been produced in which amplification has been obtained at frequencies of up to 20 GHz.

Hitherto such transistors have been constructed with the aid of MBE-techniques (Molecular Beam Epitaxi) and so-called silicon epitaxi.

Decisive drawbacks with these known processes are that they require an ultra high vacuum and highly clean surfaces. These drawbacks prevent the known processes from being integrated readily in existing processes for the manufacture of semiconductor circuits.

Thus, the known process involves growing various layers progressively one on top of the other, in order to reach a desired structure.

The present invention provides a completely novel method for producing thin conductive and semi-conductive layers embedded in mono-crystalline silicon. When compared with the aforementioned known processes, the invention provides a simple method of manufacture in which the aforementioned drawbacks encountered, inter alia, in the construction of permeable-base transistors are eliminated.

SUMMARY OF THE INVENTION

The present invention thus relates to a method for producing thin conductive or semiconductive layers embedded in silicon in the construction of structures for integrated circuits and the like, and is characterized by implanting metal atoms in a silicon substrate to a pre-determined nominal depth; and by heat-treating the silicon substrate in a manner such as to re-distribute the implanted metal atoms so as to form a conductive or semiconductive layer in said substrate.

The invention is not restricted to the manufacture of a given electronic component, but can be applied with all components occurring in integrated circuits and for printing conductors in such circuits.

The following description, however, is made with regard to the construction of various components with the aid of the present invention, by way of example only.

BRIEF DESCRIPTION OF THE DRAWINGS

The invention is described below partly with reference to an embodiment illustrated in the accompanying drawings, in which.

DESCRIPTION OF THE PREFERRED EMBODIMENTS

Figure 1:
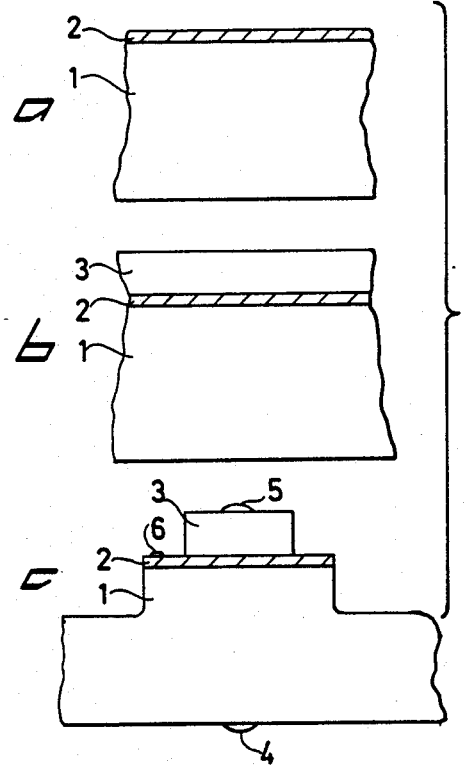
FIGS. 1a–1c illustrate the construction of a metal-base transistor when using known prior art techniques.

FIGS. 1l–1c and 2a–2c thus illustrate known techniques.

FIG. 1a illustrates a silicon plate 1 comprising monosilicon <111>, on which a metal layer 2 consisting of cobalt silicide $CoSi_2$ has been grown. The cobalt silicide grows epitaxially on <111>-silicon. As illustrated in FIG. 1b, a further silicon layer 3 can be grown epitaxially on the layer of $CoSi_2$.

Part of the uppermost silicon layer 3, the metal layer 2 and the silicon plate 1 is then removed by some suitable known method, so as to obtain the structure illustrated in FIG. 1c, in which the reference 4 identifies the collector, the reference 5 identifies the emitter and the reference 6 identifies the base of the resultant transistor element.

The metal layer 2 thus forms the base of the metal-base transistor. This layer preferably has a thickness smaller than 100 Å. A serious problem in this case when using known techniques resides in the production of a homogeneous and thin metallic layer 2 which contains no pin holes.

This problem is solved by means of the present invention, as will be apparent from the description given below with reference to FIGS. 3 and 4.

Figure 2:
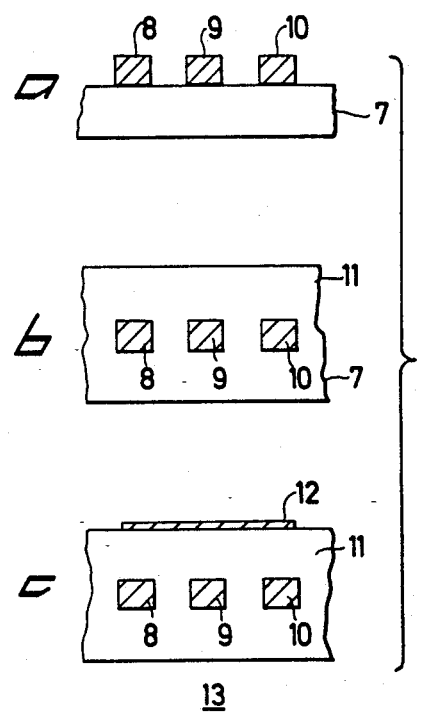
FIGS. 2a–2c illustrate the construction of a permeable-base transistor with the aid of known prior art techniques.

FIGS. 2a–2c illustrate the manufacture of a permeable-base transistor when using a known technique.

As with the example illustrated in FIGS. 1a–1c, a transistor base is formed on a monosilicon plate 7 through a multiple of elements 8,9,10 comprising, e.g., cobalt silicide, $CoSi_2$. The elements 8,9,10 have the form of fingers which are joined together at one end thereof, so as to form a base electrode. A further silicon layer 11 is then grown on the structure of 2a to form the structure of FIG. 2b, such that the base elements 8–10 are completely embedded in mono-crystalline silicon, so-called monosilicon. A metal layer 12 is then applied, this metal layer forming the emitter. The collector, referenced 13, is positioned on the undersurface of the plate 7.

Although this method is somewhat simpler than the method illustrated in FIGS. 1a–1c, it is still encumbered with the drawbacks recited in the introduction, in addition to which a simpler method of embedding conductors, such as the base elements 8–10, will be desirable.

The present invention enables conductors to be readily embedded in a monosilicon plate.

The present invention thus relates to a method for producing conductive or semiconductive layers embedded in silicon in the manufacture of structures for integrated circuits. The invention is not restricted to any particular type of such structures.

Moreover, the method is not restricted to the manufacture of layers in monocrystalline silicon, but can also be applied in the manufacture of layers embedded in polysilicon.

The present invention is characterized by implanting metal atoms to a pre-determined nominal depth in a silicon plate, or some other silicon substrate, in which a conductive or semiconductive layer is to be formed, with the aid of a known implanting method.

Figure 3:
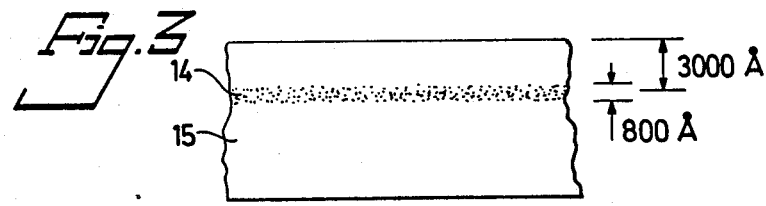
FIGS. 3 and 4 illustrate the method according to the present invention.
Figure 4:
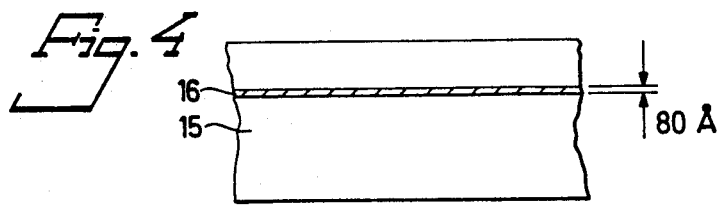

FIG. 3 illustrates metal atoms 14 implanted in a silicon plate 15. During implantation the metal atoms will disperse in the depth direction corresponding to a near gaussic distribution. By nominal depth is meant that depth which corresponds to the gravitational centre of the distribution or dispersement, said depth being predetermined by the energy with which the atoms are implanted. It has been found that dispersion in positions between the atoms is such that the atoms are distributed in the depth direction over a distance which may be equal to about 30% of the nominal implanting depth.

In accordance with one preferred embodiment of the invention, the atoms are implanted by means of high energy implantation with an energy of around 200 to 2000 keV.

It can be mentioned by way of example that cobalt (Co) is high energy implanted at an energy of 400 keV in monocrystalline silicon, the nominal depth being approximately 3000 Å. The dispersion or spread in this case is approximately 800 Å, as indicated in FIG. 3.

Subsequent to being implanted, the metal atoms are redistributed to form a conductive or semiconductive layer 16, by heat-treating the silicon substrate, in accordance with the invention.

When subjecting the silicon substrate to heat treatment, the metal atoms move closer together, due to the extremely low solubility of the implanted metal atoms in silicon. The dispersion of the metal atoms in the depth direction shrinks herewith, resulting in a unification with silicon.

The heat treatment is carried out in accordance with the invention at a temperature of from 600° C. to 1000° C. over a time period of about 60 minutes.

For example, the aforesaid substrate having cobalt atoms implanted therein may be heat treated at 900° C. for 30 minutes.

Naturally, the thickness of the conductive or semiconductive layer depends on the quantity of metal atoms implanted in the substrate. When $3.0 \cdot 10^{16}$ cobalt atoms/cm$^2$ are implanted into the substrate, there is obtained in the above example a conductive layer 16, see FIG. 4, having a thickness of about 100 Å at a depth of about 3000 Å.

Thus, the metal atoms are re-distributed to a significant extent during said heat treatment process.

Implanting damage is suffered during the implanting process. The re-treatment process, however, re-crystallises the lattice.

In the case of certain metals, the implanted metal will form with silicon a compound which takes-up a smaller specific volume than reacted silicon. Cobalt is one such metal for example. When cobalt is implanted, there is formed during the heat treatment process a layer of cobalt silicide (SoC ($CoSi_2$)) which takes-up a smaller volume in the silicon substrate than do reacted silicon atoms, i.e. shrinkage takes place.

In accordance with one preferred embodiment of the invention silicon atoms are implanted in such cases to the same depth as the implanted metal prior to carrying out said heat treatment process. The quantity of silicon implanted shall, in this case, correspond essentially to the reduction in volume obtained when forming the silicide.

When wishing to produce conductive layers, the metal atoms implanted in the silicon substrate are preferably cobalt or nickel atoms.

When wishing to produce semiconductive layers, the metal atoms implanted are preferably taken from the group of metals Iridium (Ir), Iron (Fe), Chromium (Cr), Manganese (Mn) or Magnesium (Mg). Although these metals are preferred it will be understood that other metals which exhibit a band gap upon the formation of silicide can also be used.

The primary advantages afforded by the present invention reside in the fact that it is not necessary for the surfaces to be clean and that conductive or semiconductive layers can be produced within a silicon substrate. Furthermore, the thickness of the layer can be readily controlled by selection of the implant metal dosage.

The method for producing such layers in accordance with the invention can be used in the manufacture of many different types of component in integrated circuits, among which can be mentioned, by way of example, metal-base transistors, Scottky-gate transistors or permeable-base transistors.

Furthermore, the method can be used to form circuit parts in which the circuit conductors extend beneath different components, as opposed to overlying conductors, so-called cross-overs.

When manufacturing the component described with reference to FIG. 1 by means of the present invention, the layer 2 of cobalt silicide is implanted directly down into the silicon substrate 1, so as to obtain the structure illustrated in FIG. 1b. In addition to requiring only one manufacturing stage instead of two manufacturing stages, the thickness of the layer 2 can be made very small without the occurrence of so-called pinholes.

The present invention enables rapid transistors to be readily incorporated into an IC-circuit, since the method can be readily coordinated with existing IC-circuit manufacturing techniques.

The manner in which a permeable-base transistor is constructed by means of the present invention will be described below with reference to FIGS. 5a–5c.

Figure 5A:
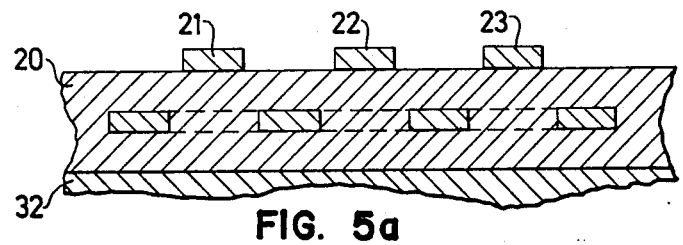
FIGS. 5a–5c illustrate the construction of a permeable-base transistor when applying the method according to the present invention.
Figure 5B:
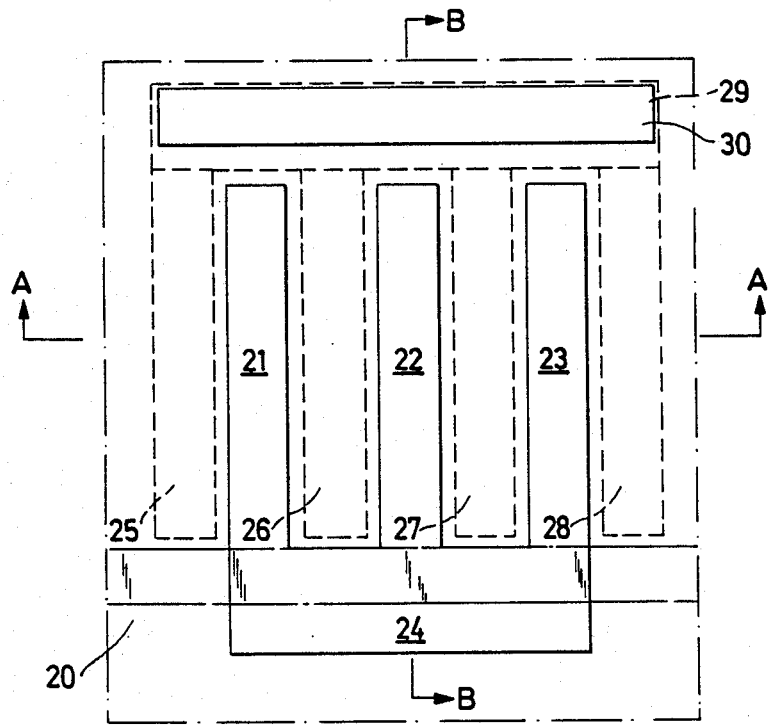
Figure 5C:
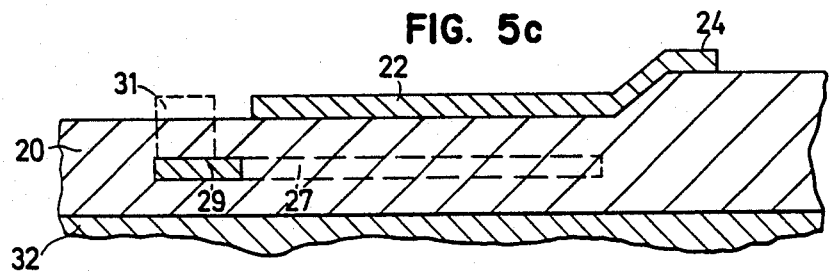

FIG. 5a is a sectional view taken on the line A—A in FIG. 5b. FIG. 5b is a top plan view of the transistor and FIG. 5c is an imaginary sectional view taken on the line B—B in FIG. 5b.

A metal is applied to a monosilicon, low-doped plate 20, to form fingers 21,22,23 which are interconnected through a conductor 24 and which form an emitter. The applied metal forms a silicide with underlying silicon.

Metal, such as cobalt for example, is then implanted in the substrate in accordance with the invention, with the emitter fingers 21–23 optionally forming a mask, either completely or partially. Implantation is effected inwardly of the broken-line region of FIG. 5b.

During the subsequent heat treatment process there is formed a base of cobalt silicide, which includes fingers 25,26,27, 28 and a conductor 29 which connects the fingers together The base is therewith fully embedded in the silicon substrate.

A metal 31 is then deposited on the upper surface of the silicon substrate 20, within the rectangle 30 drawn in full lines in FIG. 5b. The region defined by the rectangle 30 lies above the conductor 29 joining the fingers 25–28 of the transistor base. During a subsequent heat-treatment process, the applied metal 31 is caused to react with the silicon substrate 20, from the surface of the substrate down to the conductor 29.

The silicon plate is connected at the bottom thereof to a highly doped monosilicon 32 forming the transistor collector.

It will readily be understood that the present invention constitutes an important advance in this technology, since it makes possible the direct or immediate production of conductive or semiconductive layers which are embedded in a silicon substrate to form components or conductors. When desiring to locate the thus embedded layer at a greater depth than that possible with the implantation energy, silicon can be grown epitaxially on the original silicon layer.

Although the above description has been made solely with reference to certain examples of components and their construction, it will be understood that the invention is not restricted solely to this form of use.

The present invention shall not therefore be considered restricted to the aforedescribed embodiments, since it will be seen that modifications can be made within the scope of the following claims.

I claim:

1. A method for producing thin conductive or semiconductive layers embedded in silicon to form structures for integrated circuits and like devices, characterized by placing a mask on a silicon substrate and forming said mask from metallized patterned layers formed on a surface of said silicon substrate to be incorporated in the structure under construction, and implanting metal atoms in said silicon substrate to a pre-determined nominal depth through said mask, embedding said metal atoms in said silicon substrate to form the layer with a zone between said layer and said surface substantially free of said metal atoms, and thereafter subjecting said silicon substrate to heat treatment in a manner to redistribute the implanted metal atoms so as to form a separate conductive or a semiconductive layer buried in the silicon substrate, said layer being defined in its lateral dimensions by said mask.

2. A method according to claim 1, characterized by implanting in the silicon substrate one of the metals Cobalt (Co), or nickel (Ni) to form a conductive layer.

3. A method according to claim 1, characterized by implanting the silicon substrate with one of the metals Irridium (Ir), Iron (Fe), Chromium (Cr), Manganese (Mn) or Magnesium (Mg) to form a semiconductive layer.

4. A method according to claim 1, characterized by effecting said implantation with the aid of high-energy implantation with an energy of approximately 200–2000 keV.

5. A method according to claim 1, 2, 3 characterized in that said heat treatment is carried out a temperature of approximately 600° C. to 1000° C. over a time period of about 60 minutes.

6. A method according to claims 1, 2, 3 or 4, characterized in that when the implanted metal forms with silicon a compound which occupies a smaller specific volume than silicon, silicon atoms are caused to be implanted to the same depth as the metal prior to carrying out said heat treatment.

7. A method according to claims 1, 2, 3 or 4, characterized by implanting the metal atoms in a monocrystalline silicon.

8. A method according to claims 1, 2, 3 or 4, characterized in that after said implantation and heat treatment processes, a metal (31) is deposited on the silicon substrate (20), which is then caused to react, through heat treatment, with silicon in the silicon substrate (20) from the surface of said substrate down to the conductive layer (29) or semiconductive layer formed by said implantation.

* * * * *